United States Patent
Tanaka et al.

(10) Patent No.: US 7,973,323 B2
(45) Date of Patent: Jul. 5, 2011

(54) SEMICONDUCTOR DEVICE AND MANUFACTURING METHOD THEREOF, AND CAMERA MODULE INCLUDING THE SAME

(75) Inventors: Shoichi Tanaka, Kyoto (JP); Hiroto Ohsaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 12/240,313

(22) Filed: Sep. 29, 2008

(65) Prior Publication Data

US 2009/0146174 A1    Jun. 11, 2009

(30) Foreign Application Priority Data

Dec. 7, 2007  (JP) .................................. 2007-317305

(51) Int. Cl.
*H01L 27/15*  (2006.01)
*H01L 29/267*  (2006.01)
*H01L 31/12*  (2006.01)

(52) U.S. Cl. .......................................... 257/81; 257/433
(58) Field of Classification Search .................. 257/710, 257/704, 433, 81, 99, 100
See application file for complete search history.

(56) References Cited

U.S. PATENT DOCUMENTS

| | | | | |
|---|---|---|---|---|
| 5,150,180 A * | 9/1992 | Yama | | 257/680 |
| 6,509,636 B1 * | 1/2003 | Tsai et al. | | 257/678 |
| 7,088,397 B1 * | 8/2006 | Hunter et al. | | 348/374 |
| 7,378,748 B2 * | 5/2008 | Shimizu et al. | | 257/787 |
| 7,439,617 B2 * | 10/2008 | Deppisch et al. | | 257/707 |
| 7,504,670 B2 * | 3/2009 | Shiraishi et al. | | 257/99 |
| 2007/0176274 A1 | 8/2007 | Yoneda et al. | | |

FOREIGN PATENT DOCUMENTS

| | | |
|---|---|---|
| JP | 61-123288 | 6/1986 |
| JP | 2005-019116 | 1/2005 |
| JP | 2006-186288 | 7/2006 |

* cited by examiner

*Primary Examiner* — S. V Clark
(74) *Attorney, Agent, or Firm* — McDermott Will & Emery LLP

(57) ABSTRACT

A semiconductor device includes: an insulating base; a semiconductor element provided on the insulating base; a protector provided on the semiconductor element; and a frame provided on a periphery of the insulating base and surrounding the semiconductor element. A region inside the frame is filled with a sealing resin, and at least one groove is provided in an upper corner portion of the frame on the semiconductor element side of the frame.

26 Claims, 5 Drawing Sheets

SEMICONDUCTOR DEVICE AND MANUFACTURING METHOD THEREOF, AND CAMERA MODULE INCLUDING THE SAME

CROSS REFERENCE TO RELATED APPLICATION

This application claims priority under 35 U.S.C. §119 on Patent Application No. 2007-317305 filed in Japan on Dec. 7, 2007, the entire contents of which are hereby incorporated by reference.

BACKGROUND OF THE INVENTION

1. Field of the Invention

The invention relates to a semiconductor device having a semiconductor element mounted on an insulating base, such as an optical device like a solid-state imaging device using an imaging element such as a CCD (Charge Coupled Device) and a CMOS (Complementary Metal-Oxide Semiconductor), and a manufacturing method of the semiconductor device.

2. Related Art

With reduction in size of electronic equipments such as portable terminals, reduction in size of semiconductor devices has been demanded in recent years. In addition to reduction in size and thickness of semiconductor devices, quality of a reference surface is also important for secondary mounting of a semiconductor device onto a set to which the semiconductor device is to be mounted. Improvement in quality of a mounting surface has therefore also been demanded. Among semiconductor devices, this market demand is strong especially for optical devices such as solid-state imaging devices that have been widely used in video cameras and still cameras.

FIGS. 5A and 5B show a structure of a conventional solid-stage imaging device. FIG. 5A is a plan view of the solid-state imaging device. FIG. 5B is a cross-sectional view taken along line Vb-Vb' in FIG. 5A.

The solid-state imaging device is formed by using an insulating base 1. A frame 2 is provided on the periphery of the insulating base 1, and a surface of the insulating base 1 in a region located inside the frame 2 serves as an element mounting surface 3. A plurality of wiring portions 4 are extended from the periphery of the element mounting surface 3 to a bottom surface of the insulating base 1, and an optical function element 6 is fixed to the element mounting surface 3 by an adhesive 5. The optical function element 6 and the wiring portions 4 are electrically connected to each other by thin metallic wires 7. A light-transmitting protector 9 is bonded on the optical function element 6 by an adhesive 8, and a region between the frame 2 and the optical function element 6 is filled with a sealing resin 10 so as to bury the thin metallic wires 7. A top surface of the frame 2 is a mounting reference surface 13. Note that FIG. 5A is shown in a state of seeing through the sealing resin 10.

In such a solid-state imaging device, a process of dropping a liquid sealing resin by a dropping nozzle has been commonly used to fill the region between the frame 2 and the protector 9 and the optical function element 6 with the sealing resin 10. A purpose of filling the region with the sealing resin 10 is to prevent malfunction of the optical device and degradation of capability and functions of the optical device from occurring due to, for example, incidence of stray light onto a light-receiving surface of the optical function element 6. In order to accomplish this purpose, it is necessary to fill the sealing resin 10 up to an upper end face of the light-transmitting protector 9 bonded on the optical function element 6 by the adhesive 8.

Japanese Laid-Open Patent Publication No. 2006-186288 proposes a method of filling a liquid sealing resin by dropping, and bringing a package forming member into contact with a frame and the liquid sealing resin.

SUMMARY OF THE INVENTION

However, reduction in size has been required for optical device apparatuses and the frame 2 needs to be reduced in size to implement smaller optical devices. When the frame 2 has a reduced size and a liquid sealing resin is dropped by a dropping nozzle as described above, the liquid sealing resin may run onto the mounting reference surface 13, that is, the top surface of the frame 2, causing degradation in quality. This happens because the liquid sealing resin has a viscosity as low as about 1 Pa·s (pascal second). Due to the low viscosity of the liquid sealing resin, ripples are generated at the surface of the liquid sealing resin and the liquid sealing resin runs onto the mounting reference surface 13 at the moment the dropping nozzle is removed from the applied surface right after dropping of the liquid sealing resin 10 into the region between the frame 2 and the protector 9 and the optical function element 6 is completed.

Most optical devices are mounted on a camera module and the like by using the mounting reference surface 13 as a height reference. Such overflow of the sealing resin 10 onto the mounting reference surface 13 and the like therefore cause defective packaging of a camera module and the like. This problem becomes more significant as the optical device (and the frame 2) becomes smaller.

In order to suppress such ripple generation, it is possible to reduce the inner and outer diameters of the dropping nozzle for dropping the liquid sealing resin. This can suppress spreading of ripples and therefore can reduce the chance of the liquid sealing resin running onto the mounting reference surface 13. In this case, however, the dropping time of the sealing resin is increased, causing increase in manufacturing cost. This method therefore has not been commonly used.

Solving the above problem has been a challenge for reduction in size of the optical device apparatuses having a frame.

Description will now be given to the invention made by the inventors of the present application in view of the above problem. In other words, description will be given to a semiconductor device capable of filling a region inside a frame having a reduced size with a liquid sealing resin by a dropping method without causing the liquid sealing resin to run onto a mounting reference surface, a manufacturing method of the semiconductor device, and a camera module using the semiconductor device and the manufacturing method.

A semiconductor device according to the invention includes: an insulating base; a semiconductor element provided on the insulating base; a protector provided on the semiconductor element; and a frame provided on a periphery of the insulating base and surrounding the semiconductor element. A region between the frame and the semiconductor element and the protector is filled with a sealing resin, and at least one groove is provided in an upper corner portion of the frame on a semiconductor element side of the frame.

According to the semiconductor device of the invention, at least one groove is provided on the semiconductor element side (inner side) of the frame. This prevents the sealing resin from running onto a top surface of the frame when a region inside the frame is filled with the sealing resin. As a result, stable product quality and yield can be obtained for a semiconductor device having a frame with a reduced size. Moreover, since the groove can be formed simultaneously with the frame, the manufacturing cost is not increased by formation of the groove.

It is preferable that the groove is provided so as not to reach the insulating base in a height direction of the frame.

In other words, the groove is formed so as to extend downward from an inner upper end of the frame partway toward the insulating base (to a position that does not reach the insulating base). An inner wall of the frame therefore has a stepped portion at the bottom of the groove. This structure enables the sealing resin to run onto the stepped portion and to be retained in the groove when filling the region inside the frame with the sealing resin is completed. As a result, the sealing resin can be prevented from running onto a top surface of the frame.

It is also preferable that the groove is provided so as to reach the insulating base in a height direction of the frame.

In this case, the groove continuously extends from the inner upper end of the frame to the insulating base, and the inner wall of the frame has no stepped portion. In this structure, a longer distance can be obtained to calm down ripples that are generated when filling of the region inside the frame with the sealing resin is completed. The sealing resin can therefore be prevented from running onto the top surface of the frame.

Preferably, the semiconductor device further includes: a wiring portion for external connection provided on the insulating base; and a thin metallic wire electrically connecting the semiconductor element with the wring portion, and the thin metallic wire is covered by the sealing resin.

This structure ensures electric connection from the semiconductor element to the outside. Moreover, since the thin metallic wire is covered by the sealing resin, reliability is improved.

Preferably, the groove has an R-shape, a rectangular shape, or a triangular shape when the semiconductor device is viewed two-dimensionally.

An R-shaped (arc-shaped) groove can be easily formed by a round cutting drill or the like. A rectangular groove can perform its function even when ripples of the sealing resin are generated in a larger range. A triangular groove is excellent in absorbing ripples of the sealing resin without hindering the flow of the ripples.

It is preferable that the groove is provided so that at least a part of the groove reaches an outer wall of the frame.

In this structure, the part of the groove which reaches the outer wall of the frame functions as an air vent. This groove is therefore useful in resin molding. In this case, the part of the groove which reaches the outer wall of the frame has a sufficiently small dimension so that the sealing resin does not spread outside the frame.

It is also preferable that the groove is provided so as not to reach an outer wall of the frame.

In this structure, the sealing resin will not spread outside the frame.

Preferably, the semiconductor element is at least a light-receiving or light-emitting optical element and the protector is a light-transmitting member. The semiconductor device of the invention may thus be an optical device.

A camera module of the invention includes the semiconductor device of the invention. Stable product quality and yield can be thus obtained for a camera module using a semiconductor device with a reduced size.

A method for manufacturing a semiconductor device according to the invention includes the steps of: (a) providing a semiconductor element on an insulating base; (b) providing a protector on the semiconductor element; (c) providing, on a periphery of the insulating base, a frame surrounding the semiconductor element and having at least one groove formed on a semiconductor element side of the frame by removing at least an upper corner portion of the frame; and (d) filling a region between the frame and the semiconductor element and the protector with a liquid sealing resin by using a dropping nozzle.

In the method for manufacturing a semiconductor device according to the invention, the sealing resin can be prevented from running onto a top surface of the frame even when ripples are generated at a surface of the sealing resin when the dropping nozzle is lifted to finish filling of the sealing resin. This is because the groove is formed on an upper end of the frame on the semiconductor element side (inner side) of the frame by removing at least the upper corner portion of the frame and the groove thus formed can accept the sealing resin. As a result, manufacturing yield of the semiconductor device can be improved. Moreover, unlike the case where a thinner dropping nozzle is used, the dropping time of the sealing resin is not increased.

According to the semiconductor device of the invention described above, the groove provided on the inner side of the frame can suppress ripples that are generated when the dropping nozzle is removed from the applied surface right after dropping of the sealing resin is completed. As a result, product size reduction and stabilization of quality and manufacturing yield can be implemented. Moreover, since the groove is formed simultaneously with molding of the frame, formation of the groove does not affect the manufacturing cost. The invention is therefore useful as a solid-state imaging device for use in small, thin electronic equipments such as digital cameras and camera cellular phones.

DETAILED DESCRIPTION OF THE PREFERRED EMBODIMENTS

Hereinafter, a semiconductor device according to an embodiment of the invention will be described with reference to the accompanying drawings. An optical device will be herein explained as an example of the semiconductor device.

Figure 1A:
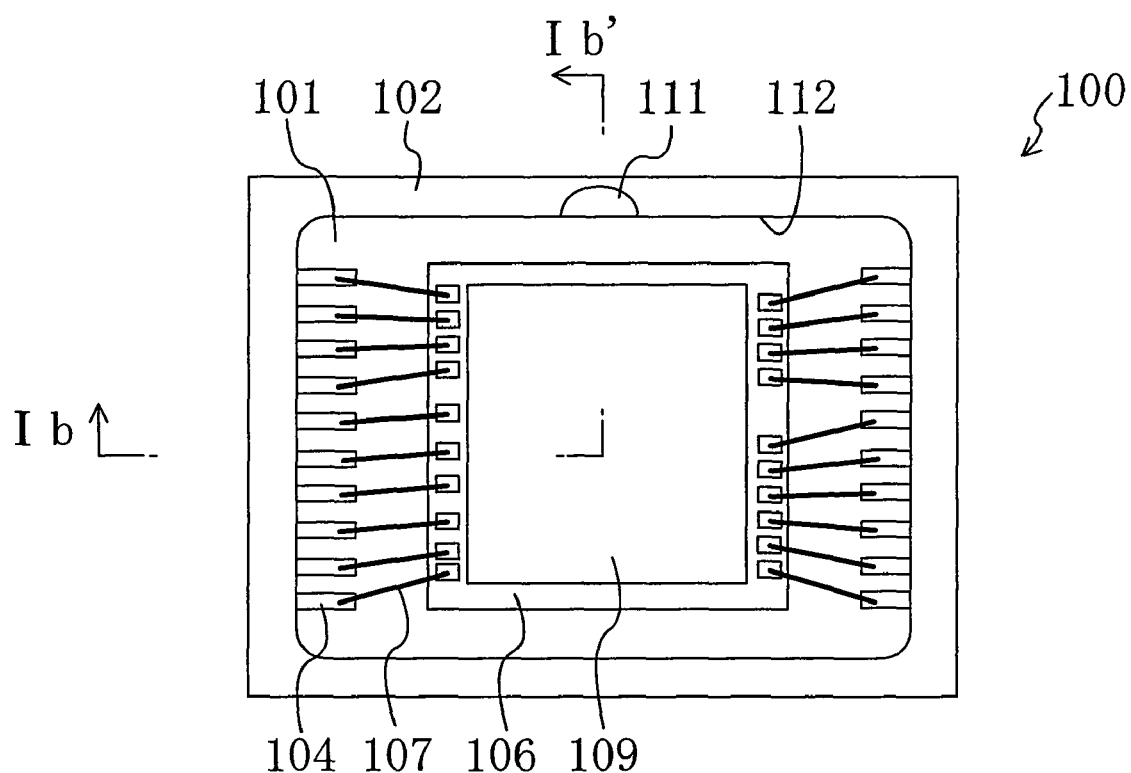
FIG. 1A is a plan view of an optical device 100 according to an embodiment of the invention.
Figure 1B:
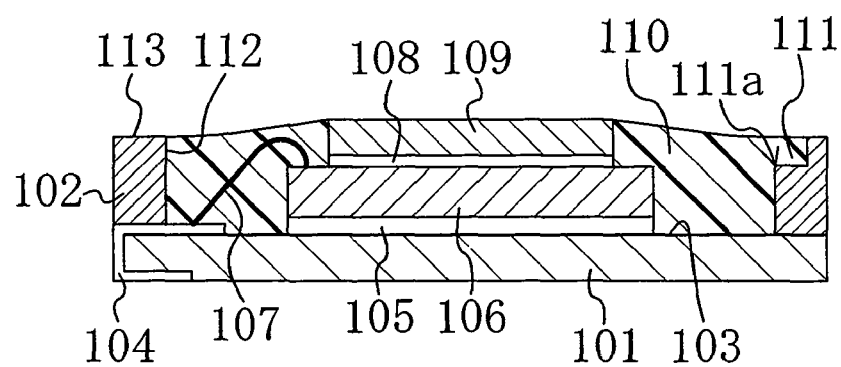
FIG. 1B is a cross-sectional view taken along line Ib-Ib' in FIG. 1A.

FIGS. 1A and 1B are diagrams showing a structure of an optical device 100 according to this embodiment. FIG. 1A is a plan view of the optical device 100, and FIG. 1B is a cross-sectional view taken along line Ib-Ib' in FIG. 1A.

The optical device 100 is formed by using an insulating base 101 made of a ceramic, a resin, or the like. A frame 102 is provided on the periphery of the insulating base 101, and a surface of the insulating base 101 in a region located inside the frame 102 serves as an element mounting surface 103. A plurality of wiring portions 104 made of, for example, metalized wiring bodies are extended from the periphery of the element mounting surface 103 to a bottom surface of the insulating base 101. An optical function element 106 is fixed to the element mounting surface 103 by an adhesive 105 such as a silver paste. The optical function element 106 is herein used as an example of a semiconductor element. The optical function element 106 and the wiring portions 104 are electrically connected to each other by thin metallic wires 107 such as Au (gold) wires. A light-transmitting protector 109 is bonded on the optical function element 106 by an adhesive 108 such as an UV (ultraviolet) adhesive containing an epoxy resin or the like as a main material. A region between the frame 102 and the optical function element 106 (and the protector 109) is filled with a sealing resin 110 containing, for example, an epoxy resin as a main material so as to bury the thin metallic wires 107. Note that a top surface of the frame 102 is a mounting reference surface 113. FIG. 1A is shown in a state of seeing through the sealing resin 110.

Figure 5A:
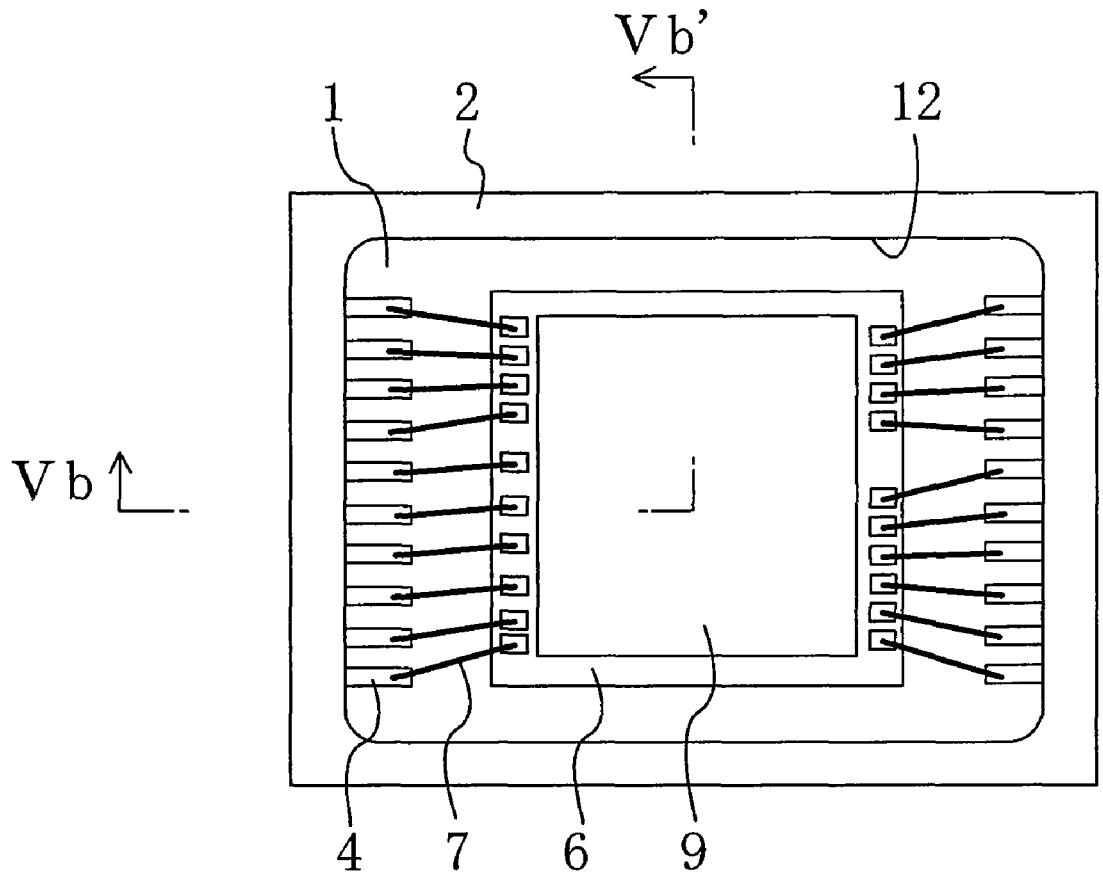
FIG. 5A is a plan view of a conventional optical device.
Figure 5B:
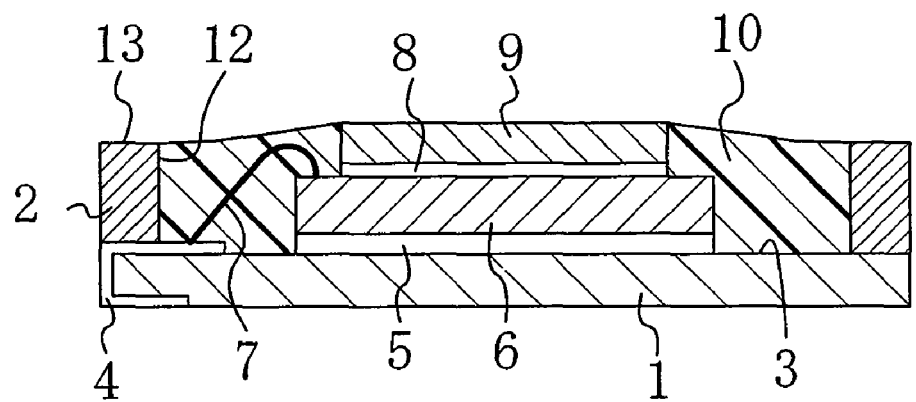
FIG. 5B is a cross-sectional view taken along line Vb-Vb' in FIG. 5A.

In the optical device 100 of this embodiment, at least one R-shaped groove 111 is formed in an inner wall 112 of the frame 102. More specifically, the groove 111 is provided on the optical function element 106 side of the frame 102 so as to remove at least an upper corner portion of the frame 102. This is one of the differences from the conventional semiconductor device shown in FIGS. 5A and 5B. Note that the R-shaped groove 111 has an R-shaped cross section parallel to the element mounting surface 103, and is provided so as to reach a top end of the frame 102 but not to reach the insulating base 101. Therefore, the inner wall 112 of the frame 102 has a stepped portion including a corner 111a at a lower end of the R-shaped groove 111.

The effects of the R-shaped groove 111 will now be described.

In order to manufacture the optical device 100, a structure including the insulating base 101, the frame 102 having the R-shaped groove 111, the wiring portions 104, the optical function element 106, and the protector 109 is first formed, and the wiring portions 104 and the optical function element 106 are then electrically connected to each other by the thin metallic wires 107. Thereafter, sealing is performed by using the sealing resin 110.

Figure 2A:
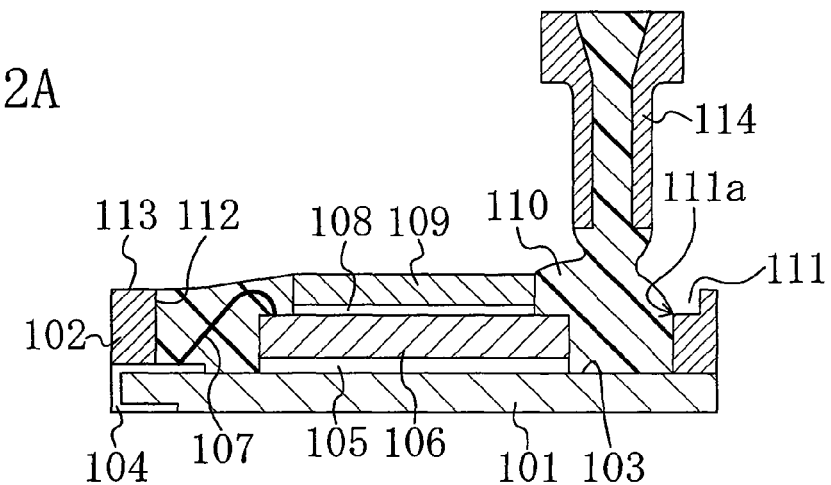
FIGS. 2A, 2B, and 2C are diagrams illustrating filling of a sealing resin 110 in a manufacturing process of the optical device 100 according to an embodiment of the invention.
Figure 2B:
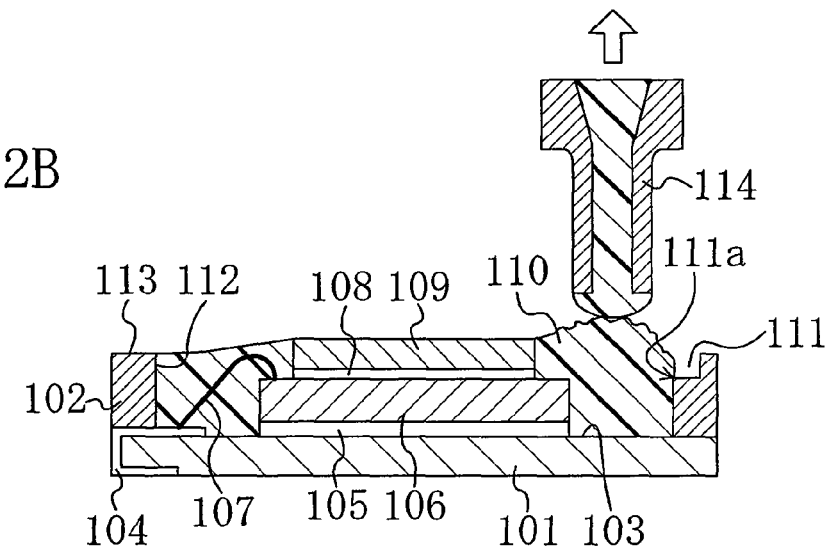
Figure 2C:
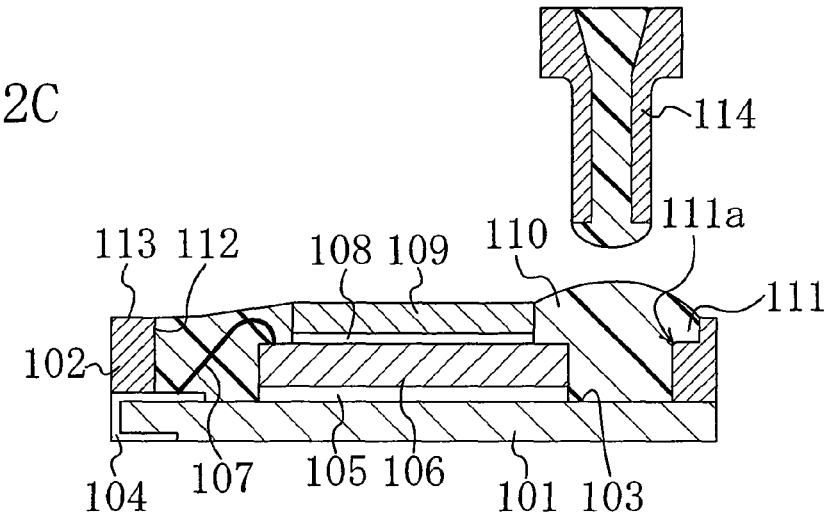

FIGS. 2A through 2C are cross-sectional views illustrating the step of filling the region between the optical function element 106 and the protector 109 fixed onto the insulating base 101 and the frame 102 with the sealing resin 110.

FIG. 2A shows a state before a dropping nozzle 114 is lifted after dropping is completed in the step of dropping a liquid sealing resin 110 onto a region between the optical function element 106 and the protector 109 and the frame 102 (hereinafter, this region is referred to as a resin sealing region) by using the dropping nozzle 114.

When the resin sealing region is filled with the sealing resin 110, the dropping nozzle 114 containing the liquid sealing resin 110 is lowered to the resin sealing region. The dropping nozzle 114 draws the resin sealing region while dropping the liquid sealing resin 110 by using an air pressure (in other words, the dropping nozzle 114 is moved as appropriate within the region), whereby the resin sealing region is filled with the sealing resin 10.

In order to finish filling, an air pressure to the dropping nozzle 114 is blocked to stop dropping of the liquid sealing resin 110. FIG. 2A shows a state right after dropping is thus stopped. A tip of the dropping nozzle 114 is connected to the liquid sealing resin 110 filling the resin sealing region. Due to a surface tension of the liquid sealing resin 110, the liquid sealing resin 110 is in contact with the corner 111a of the R-shaped groove 111 provided on the inner wall 112 side of the frame 102 and has not entered the R-shaped groove 111.

Note that, although one R-shaped groove 111 and one dropping nozzle 114 are shown herein, a plurality of R-shaped grooves 111 and a plurality of dropping nozzles 114 may be used.

Referring to FIG. 2B, after dropping of the liquid sealing resin 110 is stopped as shown in FIG. 2A, the dropping nozzle 114 is lifted to disconnect the connection between the tip of the dropping nozzle 114 and the liquid sealing resin 110. The liquid sealing resin 110 has a viscosity as low as, for example, 1 Pa·s. Ripples are therefore generated at the surface of the liquid sealing resin 110 filling the sealing resin region at the moment the connection is disconnected.

FIG. 2C shows a state in which the step of dropping the sealing resin is completed by lifting the dropping nozzle 114 after the state of FIG. 2B. In this state, the liquid sealing resin 110 has entered the R-shaped groove 111 in the frame 102 due to the ripples generated at the surface of the liquid sealing resin 110 in FIG. 2B. In other words, the liquid sealing resin 110 is kept in the state in contact with the corner 111a of the R-shaped groove 111 by a surface tension. However, this state cannot be retained due to the generated ripples. As a result, the liquid sealing resin 110 runs over the corner 111a into the R-shaped groove 111.

However, the liquid sealing resin 110 is prevented from running onto the mounting reference surface 113, that is, the top surface of the frame 102. This is implemented by actively retaining the liquid sealing resin 110 in the R-shape groove 111 even through the ripples are generated as illustrated in FIG. 2B. After FIG. 2C, the liquid sealing resin 110 is cured, whereby sealing is completed.

The liquid sealing resin 110 can thus be prevented from running onto the mounting reference surface 113. Unlike the prior art, the method of this embodiment does not require reduction in the inner and outer diameters of the dropping nozzle 114. The time required for dropping is therefore not increased. Accordingly, the tact time for dropping is not increased and increase in manufacturing cost can be prevented. Moreover, the R-shaped groove 111 can be formed simultaneously with the frame 102. The R-shaped groove 111 therefore does not affect the manufacturing cost.

As has been described above, in the semiconductor device and the manufacturing method thereof according to this embodiment, limitation of size reduction can be solved and the mounting reference surface 113 can be retained in an excellent state in a semiconductor device having a frame and being subjected to resin sealing.

Note that the R-shaped groove 111 can be formed at any position on the inner wall 112 side of the frame 102. The point is that the position where the dropping nozzle 114 is lifted to disconnect the connection with the liquid sealing resin 110 filling the resin sealing region corresponds to the formation position of the R-shaped groove 111. The R-shaped groove 111 can be formed at a position where processing is easily performed. Increase in manufacturing cost by providing the R-shaped groove 111 is also avoided in this regard.

In the case where a plurality of dropping nozzles 114 are used to perform resin sealing, a plurality of R-shaped grooves 111 need to be provided so as to correspond to the dropping nozzles 114, respectively.

It is preferable to lift the dropping nozzle 114 in an oblique direction toward the R-shaped groove 111 because the influence of ripples generated at the surface of the sealing resin can be increased in the direction of the R-shaped groove 111.

Hereinafter, the groove 111 having an R-shaped cross section in parallel to the element mounting surface 103 and a groove having another cross sectional shape will be described.

Figure 3A:
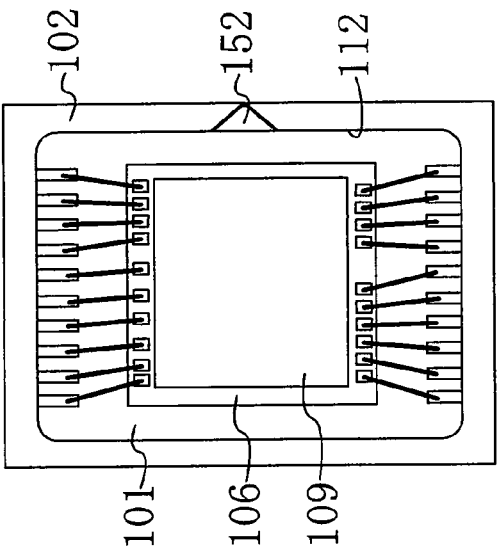
FIGS. 3A, 3B, and 3C are diagrams illustrating shapes of a cross section of a groove which is parallel to an element mounting surface in an optical device of the invention.

FIG. 3A is a plan view of the optical device 100 described above. The groove 111 provided in this optical device 100 has an R-shaped cross section (in parallel to the element mounting surface 103). With reduction in size of the semiconductor devices, the mounting reference surface 113 and the frame 102 are often also reduced in size. By forming the R-shaped groove 111 according to the shape of ripples generated at the surface of the liquid sealing resin 110, processing to the frame 102 can be performed with the minimum dimensions. In other words, since ripples are generated with a circular pattern, forming a groove having an R-shape (arc-shape) enables the function of the groove to be obtained with the smallest size.

Moreover, in the case of the R-shaped groove 111, a mold for forming the frame 102 can be processed with a round cutting drill such as an end mill. Therefore, the mold can be easily processed, and it can be said that there is no impact on the processing cost of the mold.

Figure 3B:
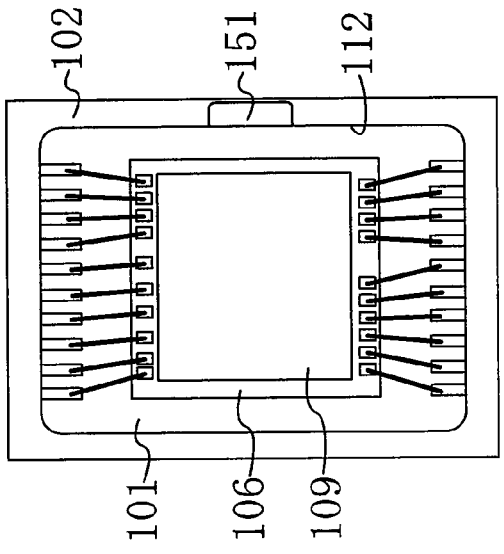

FIG. 3B shows an example of a groove 151 having a rectangular cross section parallel to the element mounting surface 103. In this case, the groove 151 has a wider inner width than that of the groove 111. The groove 151 can therefore perform its function even when the dropping nozzle 114 is lifted at a higher speed and ripples are generated in a large range. As a result, the lifting speed of the dropping nozzle 114 can be increased and productivity can be improved. Moreover, an increased width of the groove 151 enables a larger amount of liquid sealing resin 110 to be retained in the groove 151. As a result, the effect of preventing the sealing resin 110 from running onto the mounting reference surface 113, that is, the top surface of the frame 102 is improved.

Figure 3C:
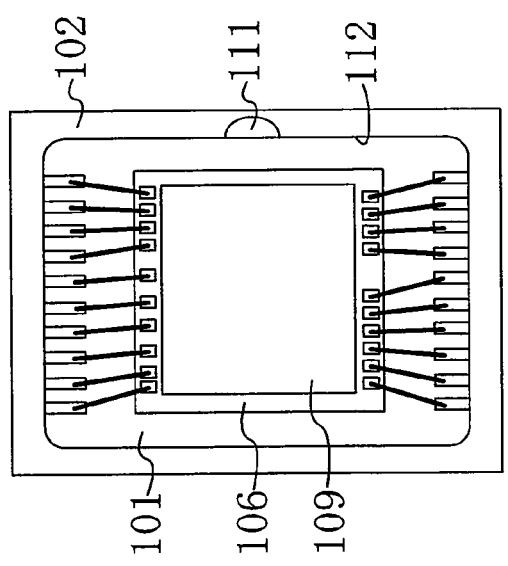

FIG. 3C shows an example of a groove 152 having a triangular cross section parallel to the element mounting surface 103. One side of the triangle is a dimension of the groove 152 in a region that is in contact with the inner wall 112 of the frame 102, and an apex located opposite to this side reaches an outer wall of the frame 102.

Since one apex of the triangular groove 152 reaches the outer wall, ripples generated in the liquid sealing resin can be absorbed without hindering the flow of the ripples. In other words, the groove 152 functions as air vent to release air in resin molding.

In order to prevent the liquid sealing resin from leaking outside the frame 102, the groove 152 has a dimension of about several tens of micrometers in the apex portion reaching the outer wall of the frame 102.

The mounting reference surface 113 is often reduced with reduction in size of the frame 102. Forming the groove 152 that reaches the outer wall portion of the frame 102 therefore enables ripples to flow smoothly and also enables the distance required for the ripples to calm down to be increased to the maximum. As a result, the liquid sealing resin can be more reliably prevented from running onto the mounting reference surface 113.

Hereinafter, the shape of a longitudinal cross section (a cross section in a height direction of the frame 102) of the groove 111 and the like will be described.

Figure 4A:
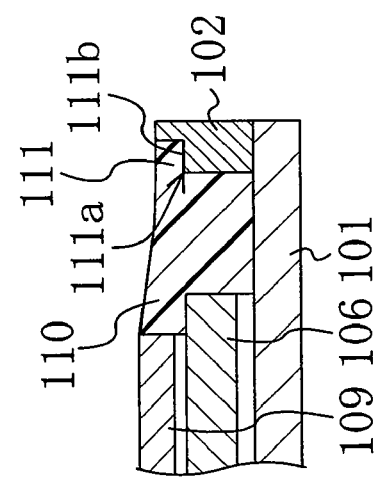
FIGS. 4A, 4B, and 4C are diagrams illustrating shapes of a cross section of a groove which is vertical to an element mounting surface in an optical device of the invention.

FIG. 4A shows a longitudinal cross section of the R-shaped groove 111 provided in the optical device 100 of the first embodiment. As described above, the groove 111 is formed so as to reach the top surface of the frame 102 and not to reach the insulating base 101. A surface 111b of the stepped portion at the bottom of the groove 111 is flat (extends in parallel with the element mounting surface 103). The distance from the mounting reference surface 113 to the surface 111b of the stepped portion is relatively short. Due to a surface tension, the liquid sealing resin 110 is therefore prevented from running over the corner 111a into the groove 111 before the dropping nozzle 114 is lifted.

Figure 4B:
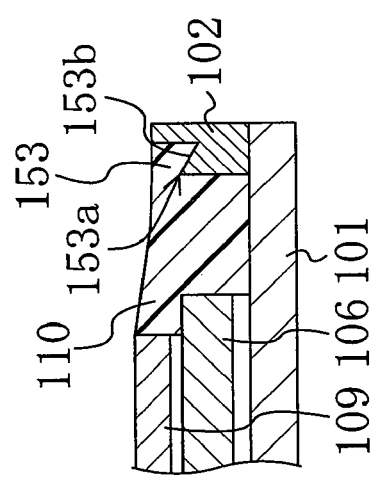

FIG. 4B, on the other hand, shows a groove 153 whose stepped portion has a tilted surface 153b. More specifically, the surface 153b is tilted downward from the inner wall 112 side of the frame 102 toward the outer wall side thereof.

In this case, ripples that are generated when the dropping nozzle 114 is lifted after dropping of the sealing resin is stopped are more likely to calm down. This is because the sealing resin running over a corner 153a onto the surface 153b of the stepped portion due to the generated ripples easily flows along the tilted surface 153b.

The groove 153 having a stepped portion with a tilted surface 153b is capable of retaining a larger amount of sealing resin 110 than a groove having a stepped portion with a flat surface 111b. The effect of preventing the sealing resin 110 from running onto the mounting reference surface 113, that is, the top surface of the frame 102 can therefore be more reliably obtained. Since the distance from the mounting reference surface 113 to the surface 153b of the stepped portion can be reduced on the inner wall 112 side, the sealing resin 110 will not enter the groove 153 before the dropping nozzle 114 is lifted.

Figure 4C:
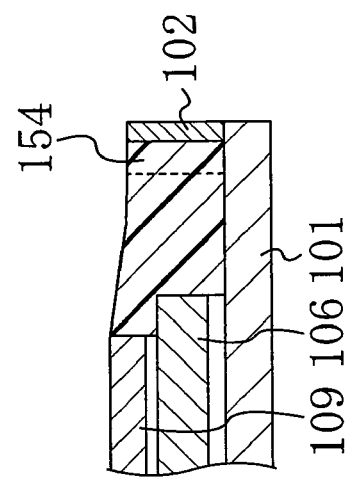

As shown in FIG. 4C, a groove 154 that reaches both the mounting reference surface 113 and the insulating base 101 may be formed in the inner wall 112 side of the frame 102. The groove 154 has no stepped portion.

The groove 154 has the same purpose of preventing the sealing resin 110 from running onto the mounting reference surface 113, but functions differently from the grooves 111 and 153 having a stepped portion. In other words, instead of retaining the sealing resin 110 when ripples are generated, the groove 154 increases the distance between the inner wall 112 of the frame 102 and the optical function element 106 and the protector 109 and thereby functions so that ripples are more likely to calm down. This is effective when the height of generated ripples is relatively low (for example, in the case where the lifting speed of the dropping nozzle 114 is set to relatively low).

Note that various shapes of the cross section parallel with the element mounting surface 103 shown in FIGS. 3A through 3C and various shapes of the longitudinal cross section shown in FIGS. 4A through 4C can be combined as appropriate.

An inexpensive, small, thin optical device and electronic equipment having excellent mounting quality can be provided by implementing the structure of each solid-state imaging device of the embodiments described above, the manufacturing method thereof, and mounting of each solid-state imaging device onto an electronic equipment such as a camera module.

The optical device of the invention is capable of implementing improved mounting quality in addition to reduction in size and thickness. The optical device of the invention is therefore useful as a solid-state imaging device for use in small, thin electronic equipments such as digital cameras and camera cellular phones.

What is claimed is:
1. An optical device, comprising:
 a bottom member;
 a semiconductor element disposed on the bottom member;
 a light-transmitting member disposed over the semiconductor element;

a side member disposed on the bottom member, the side member surrounding the semiconductor element so as to frame said semiconductor element;

a resin filling a space between the side member and the light-transmitting member; and a groove provided in an upper inner peripheral portion of the side member, wherein a top surface of a part of the resin filling the groove is located lower than a top surface of a part of the resin adjoining the light-transmitting member, said groove preventing said resin from running onto a top surface of said side member.

2. The optical device according to claim 1, wherein the groove is provided so as not to reach the bottom member in a height direction of the side member.

3. The optical device according to claim 1, wherein the groove is provided so as to reach the bottom member in a height direction of the side member.

4. The optical device according to claim 1, further comprising:
a wiring portion for external connection provided on the bottom member; and
a wire electrically connecting the semiconductor element with the wring portion, wherein the wire is covered by the resin.

5. The optical device according to claim 1, wherein the groove is provided so that at least a part of the groove reaches an outer wall of the side member.

6. The optical device according to claim 1, wherein the groove is provided so as not to reach an outer wall of the side member.

7. The optical device according to claim 1, wherein the semiconductor element is at least a light-receiving or light-emitting optical element.

8. A camera module, comprising the optical device of claim 7.

9. A method for manufacturing an optical device, comprising the steps of:
(a) providing a semiconductor element on a bottom member;
(b) providing a light-transmitting member over the semiconductor element;
(c) providing, a side member on the bottom member, the side member surrounding the semiconductor element so as to frame said semiconductor element, and having a groove formed in an upper inner peripheral portion of the side member; and
(d) filling a region between the side member and the light-transmitting member with a resin
wherein a top surface of a part of the resin filling the groove is located lower than a top surface of a part of the resin adjoining the light-transmitting member, said groove preventing said resin from running onto a top surface of said side member.

10. The optical device according to claim 1, wherein an upper part of the semiconductor element is not covered with the side member.

11. The optical device according to claim 1, wherein the side member includes a first surface, a second surface and a third surface,
the first surface and the second surface face oppositely to each other and the second surface is located at a side of the semiconductor element,
the third surface connects the first surface to the second surface, and
the groove is provided at a corner formed by the second surface and the third surface.

12. The optical device according to claim 11, wherein the first surface and the second surface are substantially perpendicular to an upper surface of the bottom member, and
the third surface is substantially parallel to an upper surface of the bottom member.

13. The optical device according to claim 9 wherein the resin is prevented from entering the groove when the resin is dropped from a dropping nozzle, and
the resin is allowed to enter the groove after the dropping of the resin is stopped.

14. The optical device according to claim 1, wherein a bottom surface of the groove is lower than a bottom surface of the light-transmitting member.

15. The optical device according to claim 1, further comprising a wire having a first terminal portion, and a second terminal portion, the first terminal portion being connected to the semiconductor element, and the second terminal portion being connected to a portion which is lower than the groove.

16. The optical device according to claim 1, further comprising a wire having a first terminal portion, and a second terminal portion, the first terminal portion being connected to the semiconductor element, and the first terminal portion is higher than a bottom surface of the groove.

17. The optical device according to claim 1, further comprising a wire having a first terminal portion, a second terminal portion and a medium portion, the first terminal portion being connected to the semiconductor element, the second terminal portion being opposed to the first terminal portion, and the medium portion being the highest portion of the wire, and
wherein a length between the first terminal portion and the medium portion is shorter than a length between the second terminal portion and the medium portion.

18. The optical device according to claim 1, wherein the groove has a bottom surface and a side surface, and a length of the bottom surface is longer than a length of the side surface in cross-section view.

19. The optical device according to claim 1, wherein the groove has a bottom surface and a side surface, and a distance between the bottom member and the bottom surface of the groove is longer than a length of the side surface in cross-section view.

20. The optical device according to claim 1, wherein the groove has a bottom surface and a side surface, and a height of the bottom surface is substantially the same as a height of a surface of the semiconductor element, the surface facing the light-transmitting member.

21. The optical device according to claim 1, wherein the groove has a bottom surface and a side surface, and a height of the bottom surface is lower than a height of a top surface of the semiconductor element.

22. The optical device according to claim 1, further comprising
a wire having a first terminal portion, and a second terminal portion located on a side opposite to the first terminal portion,
wherein the first terminal portion is connected to the semiconductor element, and
the wire is made of gold.

23. The optical device according to claim 1, wherein the bottom member is composed of a ceramic or a resin.

24. The optical device according to claim 1, wherein the groove has a R-shaped portion in plan view.

25. The optical device according to claim 1, wherein the semiconductor element is connected to the bottom member by an adhesive which is composed of silver.

26. The optical device according to claim 1, wherein
the groove has first side surfaces,
the light-transmitting member has second surfaces, and
the resin completely covers all of the first side surfaces and all of the second side surfaces.